US012663474B2

(12) United States Patent
Li et al.

(10) Patent No.: US 12,663,474 B2
(45) Date of Patent: Jun. 23, 2026

(54) BATTERY MONITORING SYSTEM INCLUDING BRIDGE COMMUNICATION DEVICE

(71) Applicant: O2Micro Inc., Santa Clara, CA (US)

(72) Inventors: Guoxing Li, Sunnyvale, CA (US); Sterling Du, Palo Alto, CA (US); Bin Zhu, Fremont, CA (US); Wei Yao, Wuhan (CN)

(73) Assignee: O2Micro Inc., Santa Clara, CA (US)

( * ) Notice: Subject to any disclaimer, the term of this patent is extended or adjusted under 35 U.S.C. 154(b) by 157 days.

(21) Appl. No.: 18/386,564

(22) Filed: Nov. 2, 2023

(65) Prior Publication Data

US 2025/0147107 A1     May 8, 2025

(51) Int. Cl.
*G01R 31/371*     (2019.01)
*G01R 31/382*     (2019.01)

(52) U.S. Cl.
CPC ......... *G01R 31/371* (2019.01); *G01R 31/382* (2019.01)

(58) Field of Classification Search
CPC ........................... G01R 31/382; G01R 31/396; G01R 31/3835; G01R 31/40; G01R 31/385; G01R 31/371; H04B 3/46; Y02E 60/10; Y02E 60/50
See application file for complete search history.

(56) References Cited

U.S. PATENT DOCUMENTS

| | | | | |
|---|---|---|---|---|
| 7,990,101 | B2 * | 8/2011 | Hoff ...................... | H01M 10/04 |
| | | | | 320/134 |
| 8,836,290 | B2 * | 9/2014 | Liu ........................ | H02J 7/0018 |
| | | | | 320/136 |
| 9,316,694 | B2 * | 4/2016 | Campbell ............ | G01R 31/371 |
| 9,559,530 | B2 * | 1/2017 | Lee ................... | H02J 13/00002 |
| 10,060,986 | B2 * | 8/2018 | Imaizumi ........... | G01R 31/3842 |
| 11,343,119 | B2 * | 5/2022 | Yamashina ....... | H04L 12/40182 |
| 12,001,993 | B2 * | 6/2024 | Khoche ................... | H04L 67/12 |

\* cited by examiner

*Primary Examiner* — Vinh P Nguyen

(57) ABSTRACT

In a bridge communication device that receives information for statuses of a battery from a monitoring device that monitors the statuses, an upstream communication port can transmit the information to an upstream bridge communication device; a downstream communication port can transmit the information to a downstream bridge communication device; a master communication module can transmit the information to a controller if the master communication module is enabled to communicate with the controller; and a slave communication module can operate in an upstream mode or a downstream mode if the master communication module is not enabled to communicate with the controller. In the upstream mode, the slave communication module transmits the information to the controller through the upstream communication port and the upstream bridge communication device. In the downstream mode, the slave communication module transmits the information to the controller through the downstream communication port and the downstream bridge communication device.

12 Claims, 7 Drawing Sheets

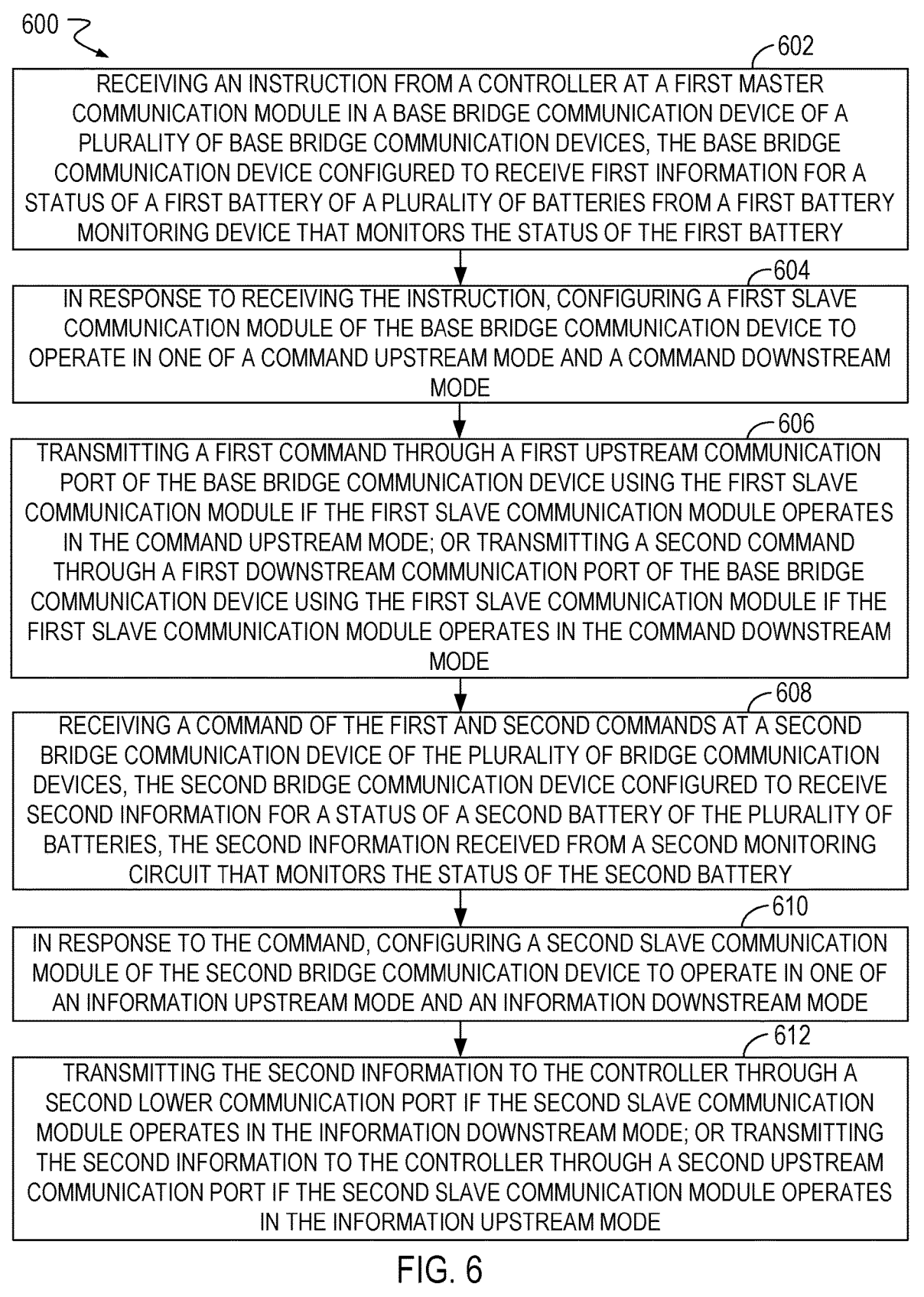

600

602

RECEIVING AN INSTRUCTION FROM A CONTROLLER AT A FIRST MASTER COMMUNICATION MODULE IN A BASE BRIDGE COMMUNICATION DEVICE OF A PLURALITY OF BASE BRIDGE COMMUNICATION DEVICES, THE BASE BRIDGE COMMUNICATION DEVICE CONFIGURED TO RECEIVE FIRST INFORMATION FOR A STATUS OF A FIRST BATTERY OF A PLURALITY OF BATTERIES FROM A FIRST BATTERY MONITORING DEVICE THAT MONITORS THE STATUS OF THE FIRST BATTERY

604

IN RESPONSE TO RECEIVING THE INSTRUCTION, CONFIGURING A FIRST SLAVE COMMUNICATION MODULE OF THE BASE BRIDGE COMMUNICATION DEVICE TO OPERATE IN ONE OF A COMMAND UPSTREAM MODE AND A COMMAND DOWNSTREAM MODE

606

TRANSMITTING A FIRST COMMAND THROUGH A FIRST UPSTREAM COMMUNICATION PORT OF THE BASE BRIDGE COMMUNICATION DEVICE USING THE FIRST SLAVE COMMUNICATION MODULE IF THE FIRST SLAVE COMMUNICATION MODULE OPERATES IN THE COMMAND UPSTREAM MODE; OR TRANSMITTING A SECOND COMMAND THROUGH A FIRST DOWNSTREAM COMMUNICATION PORT OF THE BASE BRIDGE COMMUNICATION DEVICE USING THE FIRST SLAVE COMMUNICATION MODULE IF THE FIRST SLAVE COMMUNICATION MODULE OPERATES IN THE COMMAND DOWNSTREAM MODE

608

RECEIVING A COMMAND OF THE FIRST AND SECOND COMMANDS AT A SECOND BRIDGE COMMUNICATION DEVICE OF THE PLURALITY OF BRIDGE COMMUNICATION DEVICES, THE SECOND BRIDGE COMMUNICATION DEVICE CONFIGURED TO RECEIVE SECOND INFORMATION FOR A STATUS OF A SECOND BATTERY OF THE PLURALITY OF BATTERIES, THE SECOND INFORMATION RECEIVED FROM A SECOND MONITORING CIRCUIT THAT MONITORS THE STATUS OF THE SECOND BATTERY

610

IN RESPONSE TO THE COMMAND, CONFIGURING A SECOND SLAVE COMMUNICATION MODULE OF THE SECOND BRIDGE COMMUNICATION DEVICE TO OPERATE IN ONE OF AN INFORMATION UPSTREAM MODE AND AN INFORMATION DOWNSTREAM MODE

612

TRANSMITTING THE SECOND INFORMATION TO THE CONTROLLER THROUGH A SECOND LOWER COMMUNICATION PORT IF THE SECOND SLAVE COMMUNICATION MODULE OPERATES IN THE INFORMATION DOWNSTREAM MODE; OR TRANSMITTING THE SECOND INFORMATION TO THE CONTROLLER THROUGH A SECOND UPSTREAM COMMUNICATION PORT IF THE SECOND SLAVE COMMUNICATION MODULE OPERATES IN THE INFORMATION UPSTREAM MODE

FIG. 6

BATTERY MONITORING SYSTEM INCLUDING BRIDGE COMMUNICATION DEVICE

BACKGROUND

FIG. 1A illustrates a block diagram of a conventional battery monitoring system 100 that monitors a pack of batteries 110_1-110__n_ (n=2, 3, 4, . . . ). Each of the batteries 110_1-110__n_ includes multiple battery cells. The batteries 110_1-110__n_ can be used in a high-power application environment such as an electric vehicle, a powerwall, or the like. As shown in FIG. 1A, the battery monitoring system 100 includes a set of battery monitoring devices 104_1-104__n_ (for example, each of the battery monitoring devices may include a digital front end (DFE)). Each of the battery monitoring devices 104_1-104__n_ is coupled to a corresponding battery of the batteries 110_1-110__n_, and is configured to monitor statuses (e.g., battery cell voltages, a battery current, or the like) of the corresponding battery and generate signals indicative of the monitored statuses. The signals can be transmitted to an electronic control unit (ECU) 114. Because a supply voltage of the ECU 114 is different from that of each DFE and they do not share a same reference ground, an isolator 108_1-108__n_ is provided between the ECU 114 and each of the DFEs to isolate/block the DC (direct-current) components in their communicating signals and allow the AC (alternating-current) components in the communicating signals to pass through. More specifically, the ECU 114 may be powered by a lower voltage, e.g., 12 volts. Each of the isolators 108_1-108__n_ may include a transformer circuit that can isolate the ECU 114 from a higher voltage level, e.g., 100 volts, 200 volts, 400 volts, or the like, of a battery of the batteries 110_1-110__n_ and allow the ECU 114 to receive that battery's status information from the DFE.

As shown in FIG. 1A, each of the isolators 108_1-108__n_ includes multiple pins to communicate with the ECU 114. As a result, the ECU 114 is designed to include a massive number of pins to communicate with all the isolators 108_1-108__n_, which increases the size and cost of the whole system. Moreover, because massive communications are required for the ECU 114 if the ECU communicates with the isolators 108_1-108__n_ in parallel, the ECU 114 is set to communicate with each of the isolators 108_1-108__n_ one-by-one to reduce the communication burden, which may slow down the communication process.

FIG. 1B illustrates a block diagram of the conventional battery monitoring system 100 that is placed far away from the ECU 114. For example, for an electric vehicle, the ECU 114 is usually placed in the front of the vehicle and powered by a lower-voltage battery 116, e.g., with 12 volts. The higher-voltage batteries 110_1-110__n_ (e.g., with about 400 volts, 800 volts, or the like) are usually placed in the base of the vehicle. The battery monitoring system 100 is usually placed next to the batteries 110_1-110__n_. As shown in FIG. 1B, the ECU 114 may be placed far away, e.g., 1 meter, 2 meters, etc., from the batteries 110_1-110__n_, and therefore the ECU 114 is coupled to each of the isolators 108_1-108__n_ through a corresponding long cable.

Accordingly, in the scenario shown in FIG. 1B, the ECU 114 is coupled to the isolators 108_1-108__n_ through multiple long cables, which may further increase the cost of the system. These cables may have non-negligible resistance due to the long lengths of the cables, which may increase the power consumption of the system. In addition, the possibility of failure present in communications between the ECU

114 and the isolators 108_1-108__n_ may be relatively high when using so many long cables.

Therefore, a battery monitoring solution that addresses the issues mentioned in relation to FIG. 1A and FIG. 1B will be beneficial.

SUMMARY

In an embodiment, a bridge communication device includes an upstream communication port, a downstream communication port, a master communication module, and a slave communication module. The bridge communication device is operable for receiving information for a status of a battery from a monitoring device that monitors the status of the battery. The upstream communication port is operable for transmitting the information to an upstream bridge communication device. The downstream communication port is operable for transmitting the information to a downstream bridge communication device. The master communication module is operable for transmitting the information to a controller if the master communication module is enabled to communicate with the controller. The slave communication module is coupled to the master communication module, the upstream communication port, and the downstream communication port, and is operable for operating in one of an information upstream mode and an information downstream mode if the master communication module is not enabled to communicate with the controller. In the information upstream mode, the slave communication module is operable for transmitting the information to the controller through the upstream communication port and the upstream bridge communication device; and in the information downstream mode, the slave communication module is operable for transmitting the information to the controller through the downstream communication port and the downstream bridge communication device.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

FIG. 6 illustrates an example of a flowchart of operations performed by a battery monitoring system, in an embodiment of the present invention.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications, and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Terms such as "upstream" and "downstream" are used herein as modifiers to distinguish between different devices. For example, the disclosure herein may refer to an "upstream bridge communication device" and a "downstream bridge communication device" in a battery monitoring system; however, the use of "upstream" and "downstream" in this context does not necessarily mean that the upstream bridge communication device is above (e.g., at a higher elevation relative to) the downstream bridge communication device in the battery monitoring system. As will be seen in the disclosure to follow, devices may communicate in two directions, referred to herein as the upstream direction and the downstream direction. In the upstream direction, a device may communicate with another (upstream) device situated in one direction; and in the downstream direction, that device may communicate with another (downstream) device situated in another direction. The term "first" could be used as a modifier instead of "upstream" for example, and the term "second" could be used as a modifier instead of "downstream" for example (or vice versa). However, "upstream" and "downstream" as used herein provide both ease and clarity of discussion, as will be seen from the following disclosure.

Embodiments of the present invention provide bridge communication devices and battery monitoring systems that can provide a battery monitoring solution that addresses the issues mentioned above.

Figure 2:
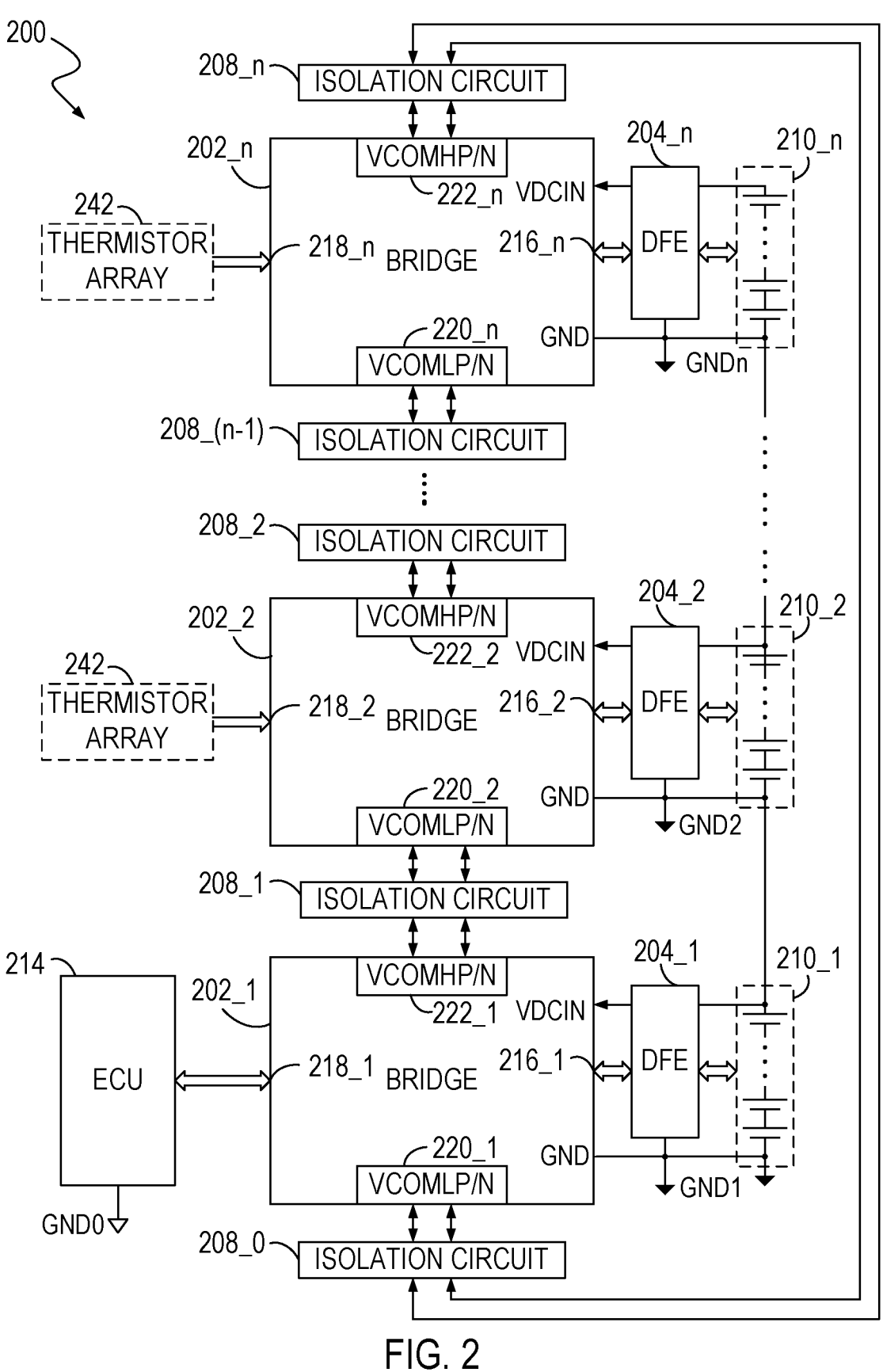
FIG. 2 illustrates a block diagram of an example of a battery monitoring system, in an embodiment of the present invention.
Figure 3:
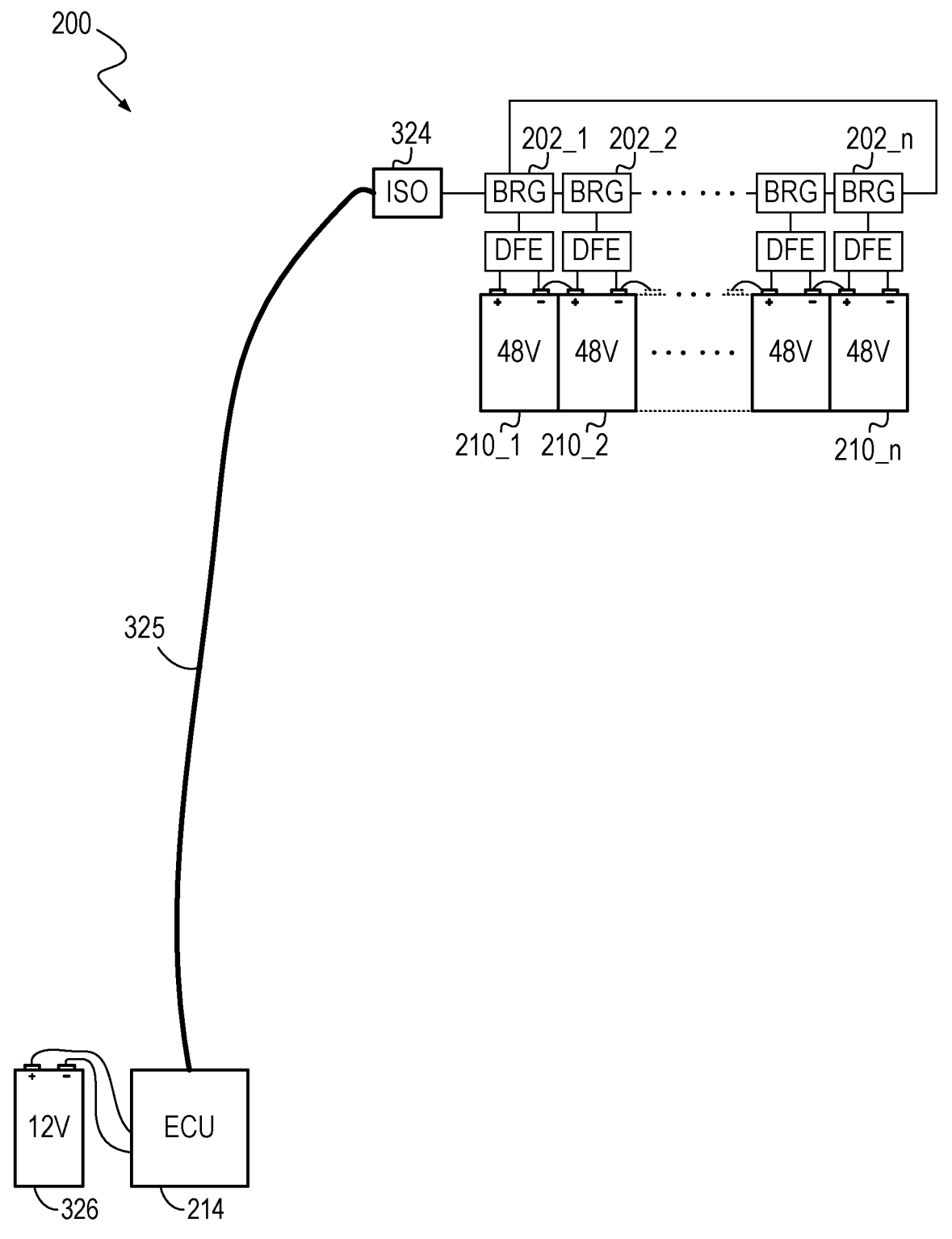
FIG. 3 illustrates a block diagram of an example of a battery monitoring system, in an embodiment of the present invention.

FIG. 2 illustrates a block diagram of an example of a battery monitoring system 200, in an embodiment of the present invention. FIG. 3 illustrates a block diagram of an example of a similar battery monitoring system, in an embodiment of the present invention. In FIG. 2 and FIG. 3, elements with the same reference numerals have similar functions.

In an embodiment, referring to FIG. 2, the battery monitoring system 200 may include a set of battery monitoring devices 204_1-204_n (for example, each of the battery monitoring devices may include a digital front end (DFE)), a set of bridge communication devices 202_1-202_n, and a set of isolation circuits 208_0, 208_1, . . . , 208_n (n=2, 3, 4 . . . ).

Each of the DFEs 204_1-204_n corresponds to a corresponding battery of a set of batteries 210_1-210_n and is operable for monitoring a status (such as, but not limited to, a battery cell voltage, a battery current, a temperature, and an abnormal condition) of the corresponding battery. In an embodiment, each of the batteries 210_1-210_n may include one or more rechargeable battery cells such as, but not limited to, lithium-ion battery cells, lithium polymer battery cells, nickel-cadmium battery cells, nickel-metal hydride battery cells, lithium iron phosphate battery cells, or lead-acid battery cells.

As shown in FIG. 2, each of the bridge communication devices 202_1-202_n may include a set of communication ports including, for example: an external communication port (e.g., 218_1, 218_2, . . . , or 218_n) operable for communicating with an external device (for example, a controller 214 or a thermistor array 242); a downstream communication port (e.g., 220_1, 220_2, . . . , or 220_n) operable for communicating with a downstream bridge communication device; an upstream communication port (e.g., 222_1, 222_2, . . . , or 222_n) operable for communicating with an upstream bridge communication device; and a DFE communication port (e.g., 216_1, 216_2, . . . , or 216_n) operable for communicating with a corresponding DFE. In an embodiment, the controller 214 includes an electronic control unit (ECU).

In an embodiment, a supply voltage $V_{DCIN}$ for each of the bridge communication devices 202_1-202_n is provided from a power supply circuit (not shown in FIG. 2) that is coupled to a corresponding battery (for example, the battery 210_1, the battery 210_2, the battery 210_3, . . . , or the battery 210_n), and that power supply circuit can transform a cell voltage supplied from one or more cells of the corresponding battery to the supply voltage $V_{DCIN}$.

Each of the bridge communication devices 202_1-202_n corresponds to a corresponding DFE of the DFEs 204_1-204_n and is designed to interface between the ECU 214 and the corresponding DFE. In an embodiment, the ECU 214 and the DFEs 204_1-204_n support different communication protocols. For example, the ECU 214 may support a first protocol (e.g., SPI (serial peripheral interface)) and the DFEs 204_1-204_n may support a second protocol (e.g., I²C (inter-integrated circuit)). In such an example, one of the bridge communication devices 202_1-202_n (e.g., the bridge communication device 202_1) may use the first protocol to receive a command (for example, a status-monitoring command that is used to instruct a corresponding DFE to monitor a status of a corresponding battery) from the ECU 214, and then may use the second protocol to transmit the command to its corresponding DFE. Similarly, that one of the bridge communication devices 202_1-202_n (e.g., the bridge communication device 202_1) may use the second protocol to receive status information (for example, information for the status of the corresponding battery in response to the status-monitoring command) from its corresponding DFE and then use the first protocol to transmit the status information to the ECU 214.

Figure 1A:
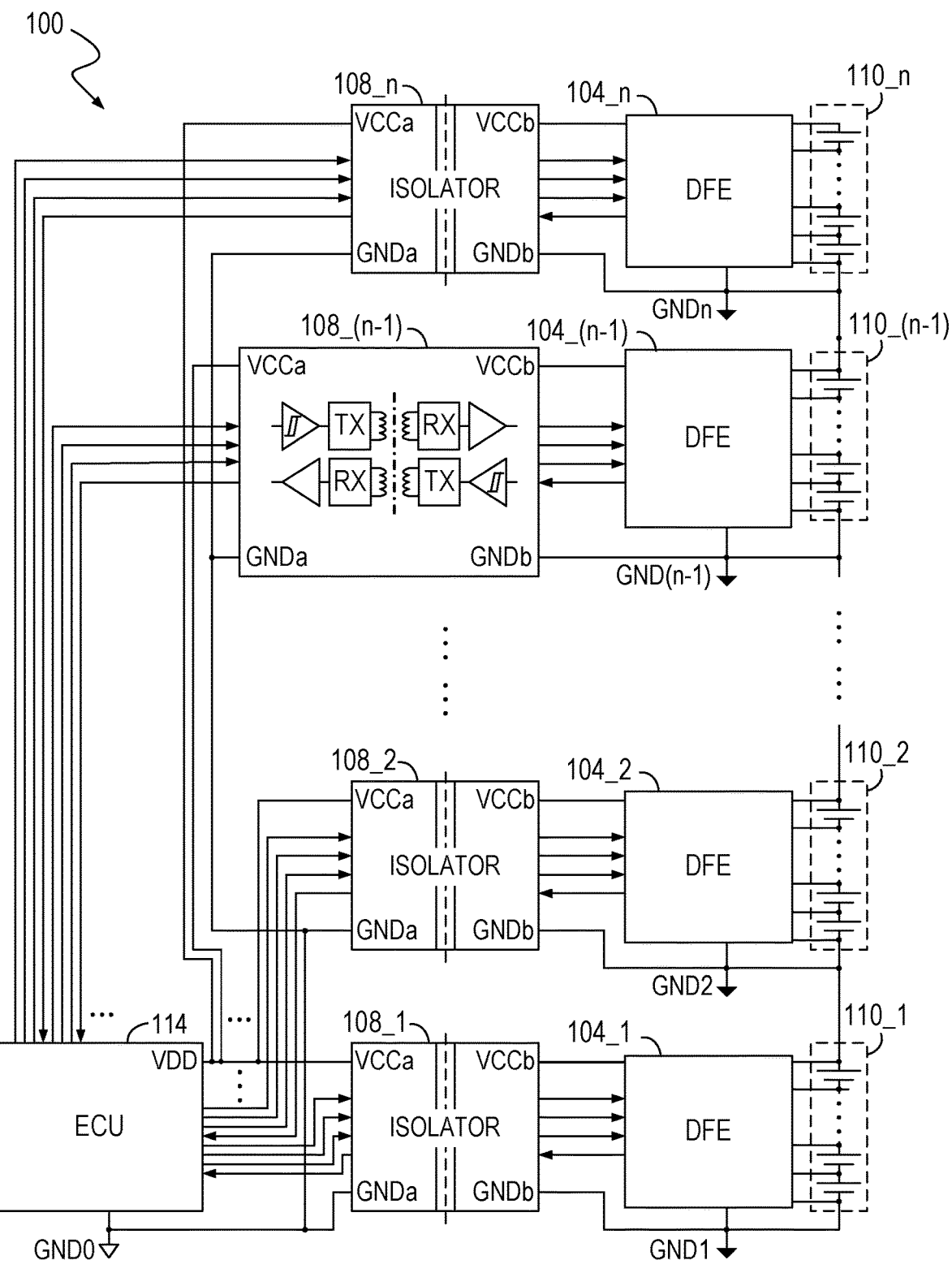
FIG. 1A illustrates a block diagram of a conventional battery monitoring system.

In an embodiment, as shown in FIG. 2, the bridge communication devices 202_1-202_n are stacked and connected in a loop. For example, the bridge communication devices 202_1, 202_2, . . . , and 202_n are sequentially coupled (for example, via an isolation circuit) one after another, and the bridge communication device 202_n is then coupled back to the bridge communication device 202_1. In an embodiment, the bridge communication devices 202_1-202_n have the same structure. In an embodiment, the ECU 214 can communicate with the bridge communication devices 202_1-202_n in a daisy-chain manner. That is, signals from the ECU 214 may be directly sent to a "base device" (for example, the bridge communication device 202_1), and then relayed by the stacked/looped devices (for example, the bridge communication devices 202_2-202_n) from one device to the next. Similarly, signals from any one of the stacked/looped devices may also be relayed by one or more intermediate devices from one device to the next until the signals reach the base device, which then transmits the signals to the ECU 214. In this manner, the ECU 214 can communicate with all the DFEs by broadcasting a command to the DFEs through the daisy-chain, and the DFEs can operate in parallel in response to the command, which increases communication efficiency of the battery monitoring system 200 compared to that of the conventional battery monitoring system 100 (FIG. 1A). Additionally, because the ECU 214 can communicate with all the DFEs through the base device 202_1, the ECU 214 can be designed to have fewer pins coupled to the base device 202_1 relative to the number of pins of the ECU 114 in the conventional battery monitoring system 100.

In an embodiment, the ECU 214 can communicate with the bridge communication devices **202_1-202_*n* in the daisy-chain manner in a downstream direction or an upstream direction. Hereinafter, to facilitate the description, a signal transmitted from an ECU (for example, the ECU 214) to the bridge communication devices (for example, the bridge communication devices 202_1-202_*n*) may be referred to as a command (or an instruction), and a signal transmitted from the bridge communication devices to the ECU may be referred to as information. In the following, a status-read command and status-response information will be used as examples to illustrate the downstream direction daisy-chain communication and the upstream direction daisy-chain communication between the ECU 214 and the bridge communication devices 202_1-202_*n*, where the status-read command is used to instruct each of the bridge communication devices 202_1-202_*n* to send status information for a corresponding battery in the batteries 210_1-210_*n* to the ECU 214**, and the status-response information includes the status of the corresponding battery in response to the status-read command. The downstream direction daisy-chain communication and the upstream direction daisy-chain communication of the present invention are also applicable to the communication of any other type of command and/or information.

Referring to FIG. 2, in the upstream direction, the ECU 214 may generate a status-read command and transmit it first to the bridge communication device 202_1 (hereinafter, the "base device"). The base device 202_1 can receive the status-read command through the communication port 218_1 and then transmit it to the next bridge communication device 202_2 adjacently coupled to the base device 202_1 through the upstream communication port 222_1. Similarly, the bridge communication device 202_2 can receive the status-read command through the downstream communication port 220_2 and then transmit the status-read command to the next bridge communication device 202_3 through the upstream communication port 222_2, and so on, until the status-read command reaches the bridge communication device **202_*n* (in this example, the bridge communication device 202_*n* is the last such device in the daisy chain to receive that command). In response to the status-read command, the bridge communication device 202_*n* can transmit status-response information (for example, including status information for the battery 210_*n*) to its adjacent bridge communication device 202_(*n*−1) through the downstream communication port 220_*n*. The bridge communication device 202_(*n*−1) can receive the status-response information of the bridge communication device 202_*n* through the upstream communication port 222_(*n*−1), and further transmit the status-response information of the bridge communication device 202_*n* to the bridge communication device 202_(*n*−2) through the downstream communication port 220_(*n*−1), and so on. As such, the base device 202_1 can obtain the status-response information of the bridge communication device 202_*n* through the bridge communication devices 202_(*n*−1), 202_(*n*−2), . . . , 202_2 and transmit it to the ECU 214. Status-response information for the other bridge communication devices can be sent to the ECU 214 in a similar manner. For example, the bridge communication device 202_(*n*−1) can send status-response information (for example, including status information for the battery 210_(*n*−1)) to the ECU 214 through the bridge communication devices 202_(*n*−2), 202_(*n*−3), . . . , 202_1**.

In an embodiment, before sending the status-read command to the bridge communication devices **202_1-202_*n*, the ECU 214 may send a direction-setting command/instruction to the bridge communication devices 202_1-202_*n* for setting the bridge communication devices 202_1-202_*n* to communicate with the ECU 214 in the upstream direction. For example, the direction-setting command/instruction may be used to set a register bit in each of the bridge communication devices 202_1-202_*n* to a first bit value (e.g., digital 1 or digital 0, depending on the implementation). In response to the register bits being set to first bit value (e.g., digital 1), the base device 202_1 may use the upstream communication port 222_1 for transmitting a command (for example, the status-read command) and for receiving information (for example, the status-response information); the bridge communication devices 202_2-202_(*n*−1) may use their corresponding upstream communication ports 222_2-222_(*n*−1) for transmitting the command and for receiving the information, and may also use their corresponding downstream communication ports 220_2-220_(*n*−1) for receiving the command and for transmitting the information; and the bridge communication device 202_*n* may use the downstream communication port 220_*n* for receiving the command and for transmitting the information. In an embodiment, the base device 202_1 may disable the downstream communication port 220_1, and the top device (for example, the bridge communication device 202_*n*) may disable the upstream communication port 222_*n***, in response to the register bits being set to digital 1.

Similarly, in the downstream direction, the ECU 214 can generate a status-read command and transmit it first to the base device 202_1. The base device 202_1 can receive the status-read command through the communication port 218_1 and then transmit it to the bridge communication device **202_*n* through the downstream communication port 220_1. Similarly, the bridge communication device 202_*n* can receive the status-read command through the upstream communication port 222_*n* and then transmit it to the next bridge communication device 202_(*n*−1) through the downstream communication port 220_*n*, and so on, until the status-read command reaches the bridge communication device 202_2 (in this example, the bridge communication device 202_2 is the last such device in the daisy chain to receive that command). In response to the status-read command, the bridge communication device 202_2 can transmit status-response information (for example, including information for the status of the battery 210_2) to its adjacent bridge communication device 202_3 through the upstream communication port 222_2, the bridge communication device 202_3 can receive the status-response information of the bridge communication device 202_2 through the downstream communication port 220_3, and further can transmit the status-response information of the bridge communication device 202_2 to the bridge communication device 202_4 through the upstream communication port 222_3, and so on. As such, the base device 202_1 can obtain the status-response information of the bridge communication device 202_2 through the bridge communication devices 202_3, 202_4, . . . , 202_*n* and transmit it to the ECU 214. Status-response information for the other bridge communication devices can be sent to the ECU 214 in a similar manner. For example, the bridge communication device 202_3 can send status-response information (for example, including status information for the battery 210_3) to the ECU 214 through the bridge communication devices 202_4, 202_5, . . . , 202_1**.

In an embodiment, before sending the status-read command to the bridge communication devices 202_1-202_n, the ECU 214 may send a direction-setting command/instruction to the bridge communication devices 202_1-202_n for setting the bridge communication devices 202_1-202_n to communicate with the ECU 214 in the downstream direction. For example, the direction-setting command/instruction may be used to set a register bit in each of the bridge communication devices 202_1-202_n to a second bit value (e.g., digital 0 or digital 1; the opposite of the first bit value). In response to the register bits being set to the second bit value (e.g., digital 0), the base device 202_1 may use the downstream communication port 220_1 for transmitting a command (for example, the status-read command) and receiving information (for example, the status-response information); the devices 202_3-202_n may use their corresponding downstream communication ports 220_3-220_n for transmitting the command and receiving the information, and use their corresponding upstream communication ports 222_3-222_n for receiving the command and transmitting the information; and the bridge communication device 202_2 may use the upstream communication port 222_2 for receiving the command and transmitting the information. In an embodiment, the base device 202_1 may disable the upstream communication port 222_1 and the bridge communication device 202_2 may disable the downstream communication port 220_2, in response to the register bits being set to digital 0.

In an embodiment, if a failure occurs in one of the bridge communication devices and/or if a loose connection occurs between two adjacent bridge communication devices, the dual-direction daisy-chain link still forms two uni-direction daisy-chain links, such that the communication between the ECU (for example, the ECU 214) and the bridge communication devices can still go on. For example, if a fault is present in one of the bridge communication devices 202_3-202_(n–1), or if two adjacent bridge communication devices are disconnected, the bridge communication devices 202_1-202_n form two separate groups, and each group may communicate with the ECU 214 in a uni-direction daisy-chain manner. For example, referring to FIG. 2, if a fault is present in the bridge communication device 202_5 (not shown, and which may be referred to herein as an intermediate bridge communication device), then the bridge communication devices 202_1-202_4 form a first group, and the bridge communication devices 202_1 and 202_n-202_6 form a second group. In such an example, the bridge communication device 202_1 would be the base device for both groups.

In an embodiment, the ECU 214 may communicate with the first group of bridge communication devices 202_1-202_4 in the upstream direction, for example, the ECU 214 may first send a command (for example, a status-read command) to the base device 202_1, and the command may then be relayed through the devices 202_2, 202_3, and 202_4. In an embodiment, before sending the command to the bridge communication devices 202_1-202_4, the ECU 214 may send a direction-setting command/instruction to the bridge communication devices 202_1-202_4 for setting the bridge communication devices 202_1-202_4 to communicate with the ECU 214 in the upstream direction. For example, the direction-setting command/instruction may be used to set a register bit in each of the bridge communication devices 202_1-202_4 to digital 1. In response to the register bits being set to digital 1, the base device 202_1 may use the upstream communication port 220_1 for transmitting the command and receiving information; the devices 220_2-220_3 may use the upstream communication ports 222_2-222_3 for transmitting the command and receiving the information, and the downstream communication ports 220_2-220_3 for receiving the command and transmitting the information; and the device 220_4 may use the corresponding downstream communication port 220_4 for receiving the command and transmitting the information.

In an embodiment, the ECU 214 may also communicate with the second group of the bridge communication devices 202_1 and 202_n-202_6 in the downstream direction, for example, the ECU 214 may first send a command (for example, a status-read command) to the base device 202_1, and the command may then be relayed through the devices 202_n, 202_(n–1), . . . , and 202_6. In an embodiment, before sending the command to the bridge communication devices 202_1 and 202_6-202_n, the ECU 214 may send a direction-setting command/instruction to the bridge communication devices 202_1 and 202_6-202_n for setting the bridge communication devices 202_1 and 202_6-202_n to communicate with the ECU 214 in the downstream direction. For example, the direction-setting command/instruction may be used to set a register bit in each of the bridge communication devices 202_1 and 202_6-202_n to digital 0. In response to the register bits being set to digital 0, the base device 202_1 may use the downstream communication port 220_1 for transmitting the command and receiving the information; the bridge communication devices 220_7-220_n may use the downstream communication ports 220_7-220_n for transmitting the command and receiving the information, and the upstream communication ports 222_7-222_n for receiving the command and transmitting the information; and the bridge communication device 202_6 may use the upstream communication port 222_6 for receiving the command and transmitting the information.

As shown in FIG. 2, the communication port 218_1 of the bridge communication device 202_1 (the base device) is used to communicate with the ECU 214. Therefore, in an embodiment, the external communication ports 218_2-218_n in each of the bridge communication devices 202_2-202_n are prevented from communicating with the ECU 214. In that embodiment, each of the ports 218_2-218_n may therefore instead be used to communicate with a peripheral device (or an external monitoring circuit) for acquiring additional information, e.g., the status information for the corresponding batteries 210_2-210_n. For example, the ports 218_2-218_n in the stacked/looped devices 202_2-202_n may each be coupled to an external thermistor array 242 to receive temperature information about the corresponding batteries 210_2-210_n, where the temperature information may be used to double-check the battery temperature. The thermistor array 242 and how the ports 218_2-218_n are used if prevented from communicating with the ECU 214 will be described below with reference to FIG. 4 and FIG. 5.

In an embodiment, as shown in FIG. 2, every two adjacently coupled bridge communication devices are electrically connected via an isolation circuit (e.g., 208_1, 208_2, . . . , or 208_n). When the adjacently coupled bridge communication devices communicate with each other, the isolation circuits 208_1-208_n can isolate/block the DC (direct-current) components in their communicating signals and allow the AC (alternating-current) components in the communicating signals to pass through. In an embodiment, each of the isolation circuits 208_1-208_n includes a transformer circuit. In another embodiment, if the bridge communication devices are placed close to each other—for example, on a same printed circuit board (PCB)—then each of the isolation circuits 208_1-208_n includes a circuit with a much simpler structure compared to that of the transformer circuit. For example, the isolation circuits 208_1-208_n can each include, but is not limited to, a pair of capacitors. Although the isolation circuits 208_1-208_n are shown as separate components in FIG. 2, each of the isolation circuits 208_1-208_n may instead be integrated inside a corresponding bridge communication device. Moreover, in the loop structure as shown in FIG. 2, the bridge communication device 202_1 and the bridge communication device 202_n are at opposite ends of the battery monitoring system 200 and so are slightly far apart relative to the distances between other bridge communication devices. In such a configuration, the isolation circuit 208_n may be placed next to the bridge communication device 202_n, and an additional isolation component (for example, an isolation circuit 208_0 as shown in FIG. 2) may be placed next to the base bridge communication device 202_1.

Figure 1B:
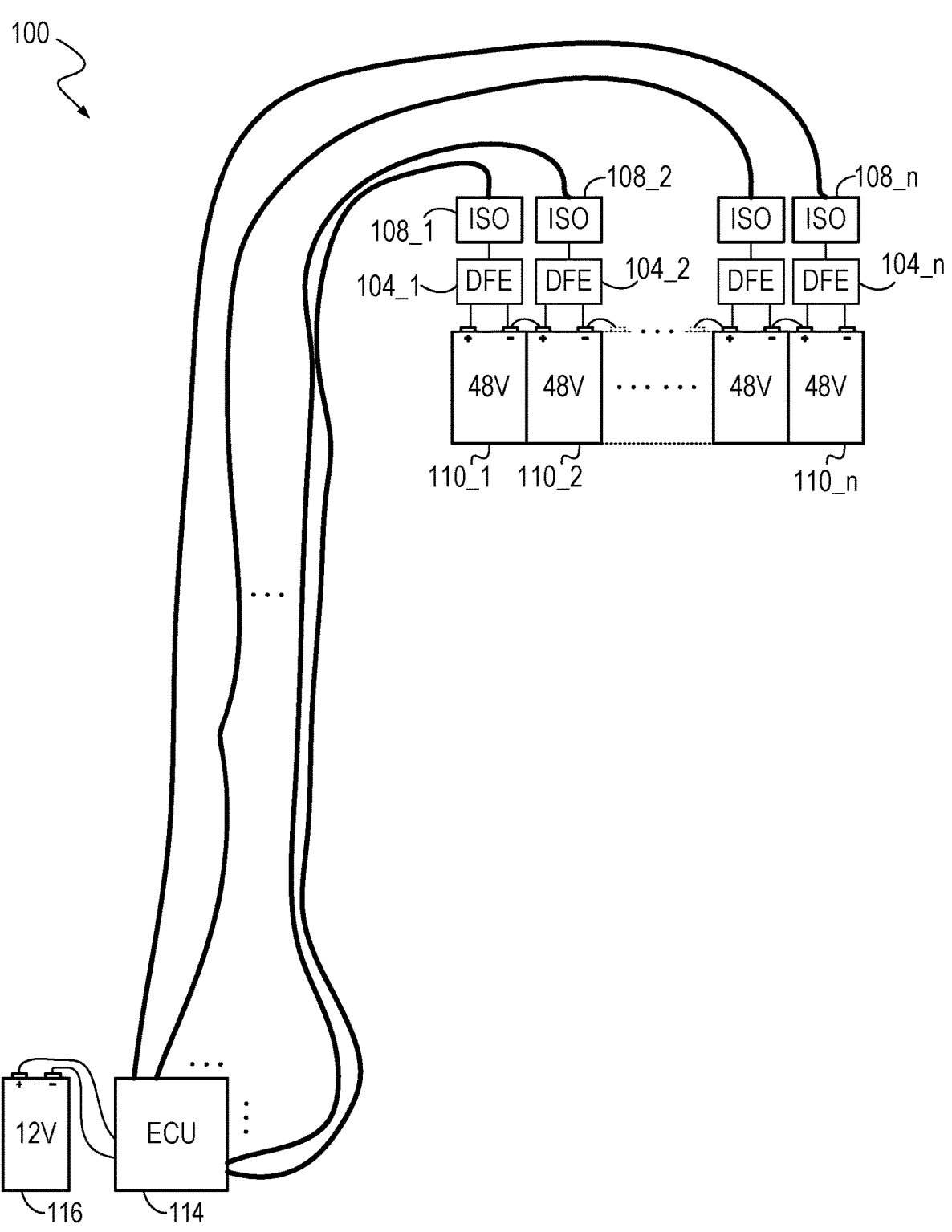
FIG. 1B illustrates a block diagram of a conventional battery monitoring system.

In the example of FIG. 2, the ECU 214 is close to the bridge communication device 202_1, and therefore the bridge communication device 202_1 can directly communicate with the ECU 214 through the communication port 218_1. However, depending on the actual application scenario of the battery monitoring system 200, the present invention is not limited thereto. For example, as shown in FIG. 3, the ECU 214 may be relatively far away (e.g., one meter, two meters, etc.) from the bridge communication device 202_1, in which case the ECU 214 is coupled to the bridge communication device 202_1 through a cable 325. In this example, the bridge communication device 202_1 can communicate with the ECU 214 through an isolator 324 and the cable 325. In such a scenario, the ECU 214 can communicate with all the DFEs through one cable, rather than through multiple cables. Therefore, the possibility of failure and non-negligible power consumption caused by multiple cables in the conventional system shown in FIG. 1B are avoided in the battery monitoring system 200 in an embodiment of the present invention.

Although in the examples of FIG. 2 and FIG. 3 the bridge communication devices 202_1-202_n are coupled to and controlled by the ECU 214 (or a host that includes the ECU 214), the present invention is not so limited. In other embodiments, the bridge communication devices 202_1-202_n can be coupled to and controlled by a micro control unit (MCU) (or a host that includes an MCU).

Figure 4:
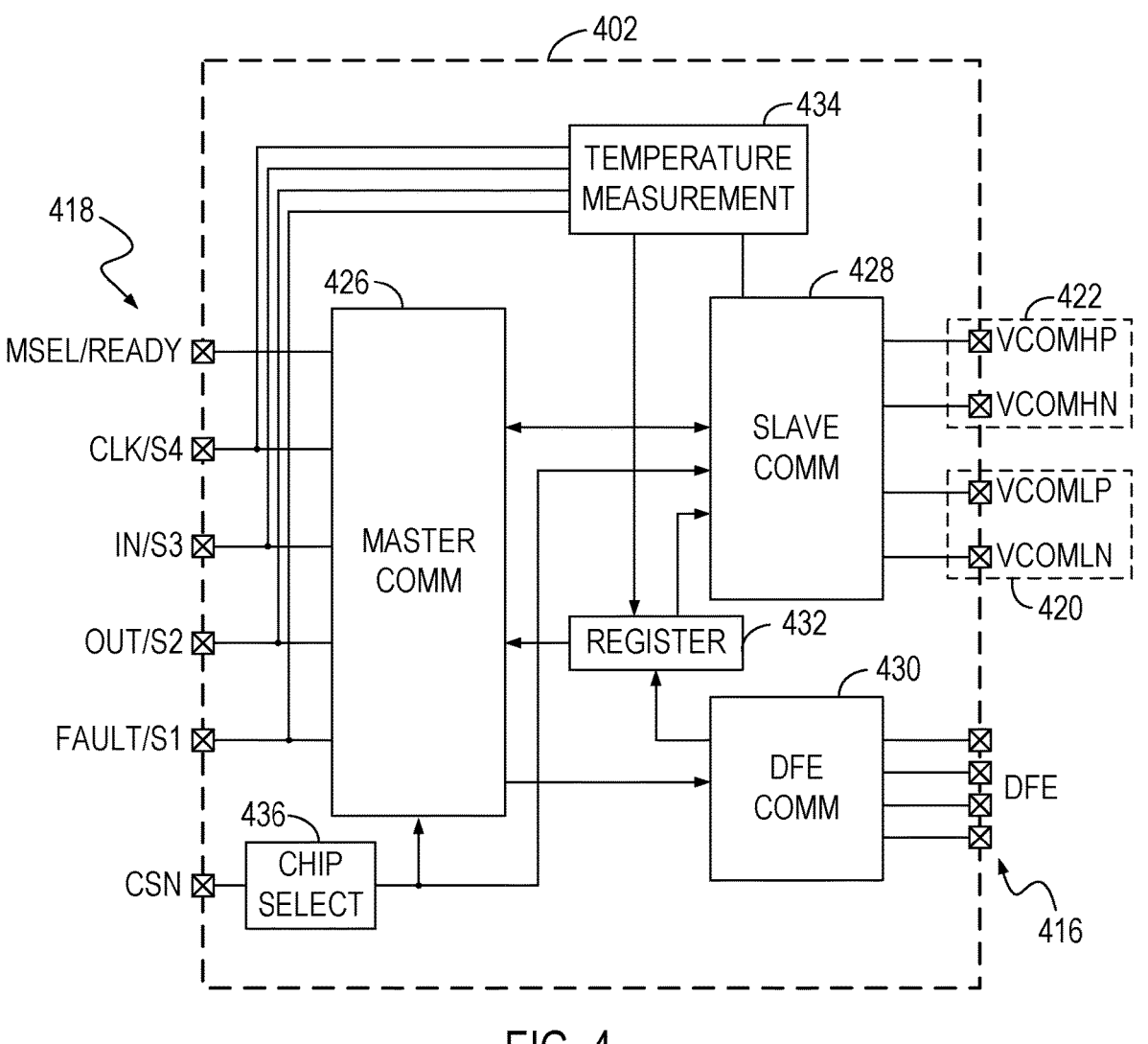
FIG. 4 illustrates a block diagram of an example of a bridge communication device, in an embodiment of the present invention.

FIG. 4 illustrates a block diagram of an example of a bridge communication device 402, in an embodiment of the present invention. The bridge communication device 402 can be an embodiment of any one of the bridge communication devices 202_1-202_n shown in FIG. 2 and FIG. 3.

As shown in FIG. 4, the bridge communication device 402 may include a master communication module 426, a slave communication module 428, a register 432, a chip selection module 436, a measuring circuit (e.g., a temperature measurement module 434), a DFE communication module 430, and a set of communication ports. The set of communication ports include, for example, an external communication port 418, an upstream communication port 422, a downstream communication port 420, and a DFE communication port 416, where each of the ports may include a set of pins. The communication ports 418, 422, 420, and 416 shown in FIG. 4 can be embodiments of the abovementioned communication ports 218_1-218_n, 222_1-222_n, 220_1-220_n, and 216_1-216_n in FIG. 2, respectively. FIG. 4 is described in combination with FIG. 2 and FIG. 3.

In an embodiment, the DFE communication module 430 in the bridge communication device 402 is operable for communicating with a corresponding DFE (e.g., an above-mentioned DFE 204_1, 204_2, . . . , or 204_n) coupled to the DFE communication port 416. For example, each of the DFEs 204_1-204_n monitors statuses of a corresponding battery in the batteries 210_1-210_n. The DFE communication module 430 in each of the bridge communication devices 202_1-202_n may receive status information for a corresponding battery from a corresponding DFE 204_1, 204_2, . . . , or 204_n. The received information may then be stored in the register 432, and can be accessed by the master communication module 426 and/or the slave communication module 428, for transmission to an ECU (for example, the ECU 214 shown in FIG. 2 and FIG. 3), directly or through an adjacent bridge communication device. Although the register 432 is shown as a separate component in FIG. 4, the register 432 may instead be a dedicated register inside a memory or storage device (not shown) of the bridge communication device 402, and so the present invention is not limited thereto. In an embodiment, the DFE communication module 430 is compatible with multiple types of DFEs that support different communication protocols. More specifically, to facilitate the adaptability/compatibility between the bridge communication device 402 and the corresponding DFE, the DFE communication module 430 may be operable for supporting multiple communication protocols (for example, including but not limited to UART (universal asynchronous receiver-transmitter) protocol, SPI protocol, and I2C protocol), and the DFE communication module 430 can communicate with the corresponding DFE by selecting the same protocol used by the corresponding DFE. For example, the DFE communication module 430 may select the communication protocol according to a selection signal received from a pin MSEL/READY.

In an embodiment, the bridge communication device 402 may be configured as a base device (e.g., the bridge communication device 202_1 shown in FIG. 2 and FIG. 3) or as one of the stacked or looped devices (e.g., one of the bridge communication devices 202_2-202_n shown in FIG. 2 and FIG. 3) based on a chip selection signal received from a pin CSN. For example, according to the chip selection signal, the master communication module 426 in the base device (e.g., 202_1) may be enabled for communicating with an ECU (e.g., the ECU 214 shown in FIG. 2 and FIG. 3), and the master communication module 426 in a stacked or looped device (e.g., 202_2) may be disabled from communicating with the ECU (in other words, the master communication module 426 is not enabled to communicate with the ECU). For example, the chip selection module 436 may be operable for receiving the chip selection signal from the pin CSN, and operable for enabling or disabling the master communication module 426 according to the chip selection signal. For example, if the chip selection signal is logic low (or logic high, depending on the implementation), the chip selection module 436 may enable the master communication module 426 such that the bridge communication device 402 can be configured as the base device, and if the chip selection signal is logic high (or logic low, depending on the implementation), the chip selection module 436 may disable the master communication module 426 such that the bridge communication device 402 can be configured as a stacked or looped device.

In an embodiment, if the bridge communication device 402 functions as a base device and is coupled to the ECU (e.g., the ECU 214 shown in FIG. 2 and FIG. 3), then the master communication module 426 in the bridge communication device 402 is enabled, and is operable for communicating with the ECU through the port 418. For example, the master communication module 426 may receive a command (e.g., a status-read command) from the ECU and transmit information (e.g., status-response information) to the ECU.

In an embodiment, the master communication module 426 in the base device may directly communicate with the ECU. FIG. 4 shows an example in which the master communication module 426 communicates with the ECU through the SPI protocol. As shown in FIG. 4, the port 418 may include a set of pins, e.g., the pin MSEL/READY, a pin CKL/S4, a pin IN/S3, a pin OUT/S2, and a pin FAULT/S1. In an embodiment, if the master communication module 426 is enabled—that is, the bridge communication device 402 is configured as a base device—then some of those pins (e.g., CKL/S4, IN/S3, OUT/S2, and FAULT/S1) are used for communication between the ECU and the master communication module 426. For example, the master communication module 426 may receive a command (e.g, a status-read command from the ECU through the pin IN/S3) and transmit information (e.g., status-response information) to the ECU through the pin OUT/S2. The pin CKL/S4 may be used to receive serial clock signals for SPI-based communication. The pin FAULT may be used for transmitting a fault signal to the ECU to indicate that a fault condition is present somewhere in the daisy-chain of devices in the battery monitoring system 200 (FIG. 2). The pin MSEL/READY may be used to instruct the DFE communication module 430 to select a protocol (for example, the SPI protocol, the UART protocol, or the I²C protocol) to use to communicate with the corresponding DFE. More specifically, in an embodiment, during a chip power-on reset, a latch of the pin MSEL/READY samples a voltage level (e.g., a supply voltage $V_{DCIN}$ of the bridge communication device 402) as strapping bits of "0" or "1" and holds these bits for a predetermined time period (e.g., typically one millisecond), and the strapping bits may be transmitted to the DFE communication module 430 to instruct the DFE communication module 430 which communication protocol to select for communicating with the corresponding DFE. In an embodiment, after the predetermined time period, the pin MSEL/READY is used to transmit an SPI ready signal to the ECU.

In an embodiment, if the bridge communication device 402 functions as a stacked or looped device, then the master communication module 426 is disabled from communicating with the ECU (in other words, the master communication module 426 is not enabled to communicate with the ECU). In such an embodiment, the port 418 can be used to communicate with a peripheral device (or an external monitoring circuit) for acquiring additional information (e.g., status information for a corresponding battery, e.g., the battery 210_2, 210_3, . . . , or 210_n shown in FIG. 2 and FIG. 3), and for transmitting the acquired additional information to the temperature measurement module 434. For example, some of the pins (e.g., CKL/S4, IN/S3, OUT/S2, and FAULT/S1) of the port 418 may be coupled to an external temperature monitoring circuit (e.g., shown as the thermistor array 242 in FIG. 2). The temperature monitoring circuit may be configured to acquire information about the temperature of the battery and transmit that information to the temperature measurement module 434 through some of those pins, where the temperature information may be used to provide additional protection for the battery against overheating. As shown in FIG. 4, the chip selection signal received from the pin CSN can be further transmitted to the temperature measurement module 434 (e.g., through the slave communication module 428) to enable or disable the temperature measurement module 434. For example, if the chip selection signal is logic low (or logic high, depending on the implementation), then the chip selection module 436 may disable the temperature measurement module 434; and if the chip selection signal is logic high (or logic low, depending on the implementation), then the chip selection module 436 may enable the temperature measurement module 434. The present invention is not so limited. In other embodiments, the chip selection signal is directly transmitted to the temperature measurement module 434; that is, it is not transmitted through the slave communication module 428.

Figure 5:
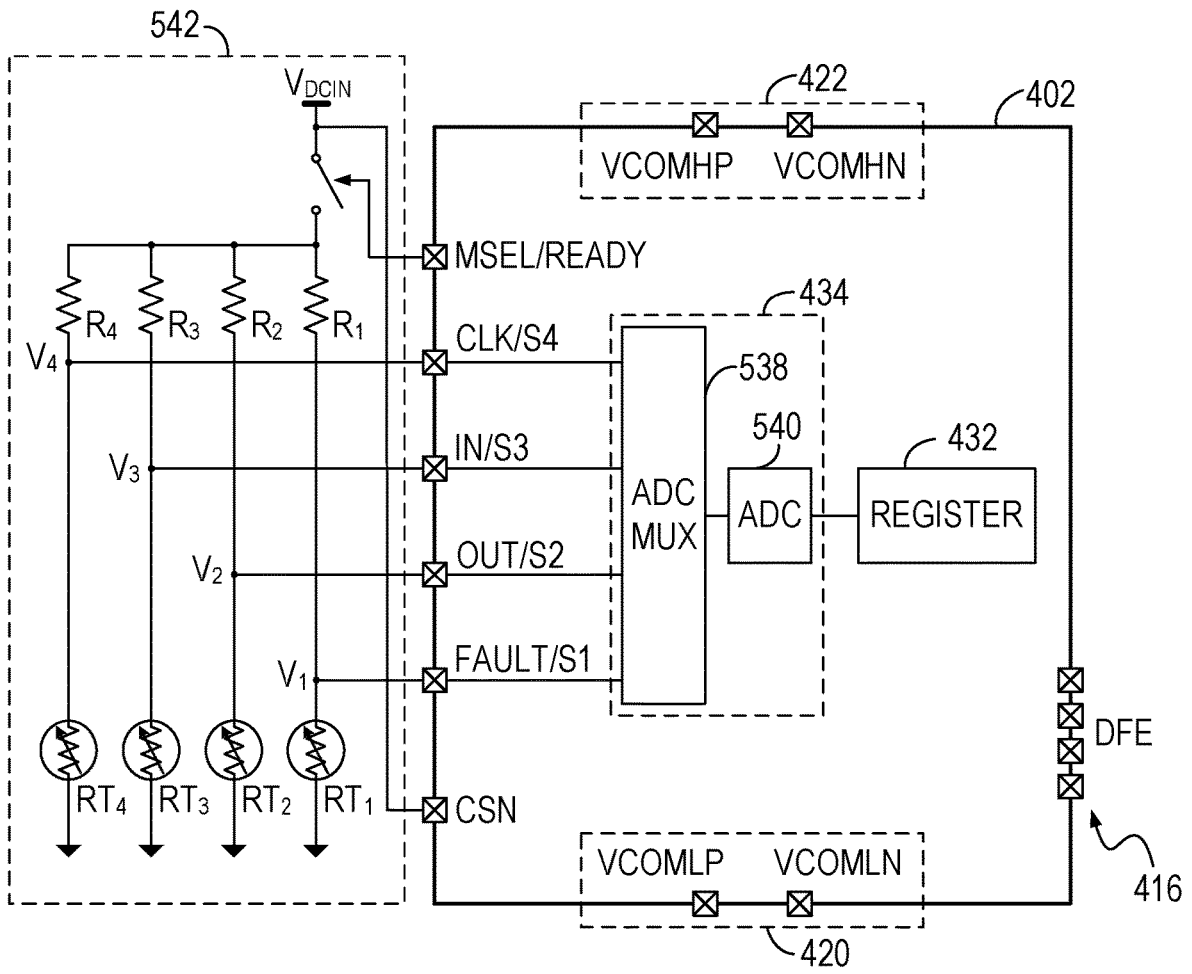
FIG. 5 illustrates a circuit diagram of an example of a temperature monitoring circuit, in an embodiment of the present invention.

In an embodiment, the temperature monitoring circuit (e.g., the thermistor array 242 of FIG. 2) includes a negative temperature coefficient (NTC) thermistor whose resistance value changes with temperature. FIG. 5 illustrates a circuit diagram of an example of a temperature monitoring circuit 542, in an embodiment of the present invention. FIG. 5 is described in combination with FIG. 2, FIG. 3, and FIG. 4. The temperature monitoring circuit 542 can be an embodiment of the thermistor array 242.

As shown in FIG. 5, the temperature monitoring circuit 542 includes a set of resistors $R_1$, $R_2$, $R_3$, and $R_4$ and a set of NTC thermistors $RT_1$, $RT_2$, $RT_3$, and $RT_4$. Each NTC thermistor is connected with a corresponding resistor (e.g., $R_1$, $R_2$, $R_3$, or $R_4$) to form a voltage dividing circuit. The NTC thermistors $RT_1$, $RT_2$, $RT_3$, and $RT_4$ may be near different battery cells in a corresponding battery (e.g., the battery 210_1, 210_2, . . . , or 210_n), and used to sense temperatures for different parts of the battery. The temperature of each NTC thermistor of the NTC thermistors $RT_1$, $RT_2$, $RT_3$, and $RT_4$ may be indicated by a voltage on that NTC thermistor. As shown in FIG. 5, the voltages (for example, $V_1$, $V_2$, $V_3$, and $V_4$) of the NTC thermistors $RT_1$, $RT_2$, $RT_3$, and $RT_4$ are transmitted to the temperature measurement module 434 through the pins CKL/S4, IN/S3, OUT/S2, and FAULT/S1, respectively. However, the present invention is not so limited, and those skilled in the art may design any temperature monitoring circuit to measure the temperature of the corresponding battery.

As shown in FIG. 5, in an embodiment, the temperature measurement module 434 includes an analog-to-digital converter (ADC) multiplexer 538 and an ADC 540. For example, the ADC multiplexer 538 may receive the voltages (for example, $V_1$, $V_2$, $V_3$, and $V_4$) on the NTC thermistors $RT_1$, $RT_2$, $RT_3$, and $RT_4$ from the temperature monitoring circuit 542, and selectively transmit one of the voltages to the ADC 540. The ADC 540 may convert an analog signal, indicative of the temperature (for example, indicated by the voltage) measured by the corresponding one of the NTC thermistors $RT_1$, $RT_2$, $RT_3$, and $RT_4$, to a digital signal. In an embodiment, the converted digital value of the signal indicative of the temperature of the corresponding battery may be stored in the register 432, such that it can be accessed by the master communication module (for example, the master communication module 426 shown in FIG. 4) and/or by the slave communication module (for example, the slave communication module 428 shown in FIG. 4), each of which is operable for transmitting information for the digital value to an ECU, directly or through an adjacent bridge communication device.

Returning to FIG. 4, in an embodiment, the slave communication module 428 in the bridge communication device 402 is operable for communicating with another bridge communication device (for example, with an adjacent bridge communication device in a battery monitoring system with multiple bridge communication devices stacked and communicating with each other in a daisy-chain manner) through the upstream communication port 422 (or the downstream communication port 420, depending on the direction of the daisy-chain communication). For example, the slave communication module 428 in the bridge communication device 402 may communicate with another slave communication module in the adjacent bridge communication device through a daisy-chain-based communication protocol. In an embodiment, the slave communication module 428 transmits and/or receives signals in a differential manner. For example, as shown in FIG. 4, each of the ports 420 and 422 includes a pair of terminals (e.g., VCOMHP/VCOMHN or VCOMLP/VCOMLN), and the signals communicated between the slave communication module 428 in the bridge communication device 402 and the slave communication module in the adjacent bridge communication device are transmitted/received in pairs at the pair of terminals. The paired signals have equal magnitudes but opposite polarities, and the information to be communicated can be indicated by the difference between these two signals.

As previously stated herein, if the bridge communication device 402 functions as a base device (e.g., the bridge communication device 202_1 shown in FIG. 2 and FIG. 3), then the bridge communication device 402 may directly communicate with the ECU (e.g., the ECU 214 shown in FIG. 2 and FIG. 3) through the external communication port 418. For example, the master communication module 426 may receive a command (e.g., a status-read command) from the ECU through the external communication port 418, and then the slave communication module 428 may transmit the command to the stacked/looped devices (e.g., bridge communication devices 202_2-202_n) through the upstream communication port 422 (or the downstream communication port 420, depending on the direction of the daisy-chain communication). In an embodiment, in response to receiving a direction-setting command/instruction from the ECU, the slave communication module 428 in the base device is operable for operating in a command downstream mode or a command upstream mode, due to the loop structure as shown in FIG. 2 and FIG. 3. For example, in the command upstream mode, the slave communication module 428 may be operable for transmitting the command to an upstream adjacent bridge communication device (e.g., the bridge communication device 202_2 shown in FIG. 2 and FIG. 3) through the upstream communication port 422; and in the command downstream mode, the slave communication module 428 may be operable for transmitting the command to a downstream adjacent bridge communication device (e.g., the bridge communication device 202_n shown in FIG. 2 and FIG. 3) through the downstream communication port 420. In an embodiment, the slave communication module 428 is configured to operate in the command downstream mode or the command upstream mode according to the previously received direction-setting command/instruction.

If the bridge communication device 402 functions as a stacked or looped device, then the master communication module 426 is not enabled and the bridge communication device 402 may communicate with the ECU through one or more intermediate bridge communication devices coupled between the ECU and the device 402 in a daisy-chain manner. For example, the bridge communication device 402 may receive a command (for example, a status-read command) sent from the ECU through the one or more intermediate bridge communication devices. If there is response information responsive to the received command (for example, status-response information in response to the status-read command), then the bridge communication device 402 may send the response information back to the ECU through the one or more intermediate bridge communication devices. In an embodiment, due to the loop structure, the slave communication module 428 in the stacked/looped device may be operable for operating in an information downstream mode or an information upstream mode, in response to the command from the ECU. In an embodiment, in the information upstream mode, the slave communication module 428 is operable for transmitting the response information to the ECU through the one or more intermediate bridge communication devices and through the upstream communication port 422. In the information downstream mode, the slave communication module 428 is operable for transmitting the response information to the ECU through the one or more intermediate bridge communication devices and through the downstream communication port 420. In an embodiment, the slave communication module 428 is configured to operate in the information downstream mode or the information upstream mode according to a previously received direction-setting command/instruction.

More specifically, taking FIG. 2 for example, each of the bridge communication devices 202_1-202_n in FIG. 2 and FIG. 3 can be embodied by the bridge communication device 402. If the previously received direction-setting command indicates that the bridge communication devices 202_1-202_n communicate with the ECU 214 in the upstream direction, then the slave communication module 428 in the bridge communication (e.g., base) device 202_1 may operate in a command upstream mode, and will transmit a command (hereinafter, first command, e.g., a status-read command) to the bridge communication device 202_2 through the upstream communication port 222_1 (e.g., the port 422 shown in FIG. 4). The slave communication module 428 in the bridge communication device 202_2 may also operate in the command upstream mode and transmit the first command to the bridge communication device 202_3 through the upstream communication port 222_2. In a similar manner, the first command may be relayed through the devices 202_3, 202_4, ... and 202_n. In response to the first command, the bridge communication devices 202_2-202_n may send their response information (if there is any, e.g., status-response information) back to the ECU 214 in an information downstream mode. For example, the bridge communication device 202_n may use its slave communication module 428 to transmit its own response information to the bridge communication device 202_(n−1) through the downstream communication port 220_n (e.g., the port 420 shown in FIG. 4), the slave communication module 428 in the bridge communication device 202_(n−1) may receive the response information of the bridge communication device 202_n through the upstream communication port 222_(n−1) and then relay the response information to the bridge communication device 202_(n−2) through the downstream communication port 220_(n−1), and so on, until the response information of the bridge communication device 202_n reaches the base device 202_1, which then transmits the response information to the ECU 214. Response information for the other bridge communication devices can be sent to the ECU 214 in a similar manner. For example, the bridge communication device 202_(n−1) may use its slave communication module 428 to transmit its own response information to the ECU 214 through the bridge communication devices 202_(n–2), 202_(n–3), . . . , 202_1, and through the downstream communication ports 220_(n–1), 220_(n–2), . . . , 220_2.

Similarly, if the previously received direction-setting command indicates that the bridge communication devices 202_1-202_n communicate with the ECU 214 in the downstream direction, then the slave communication module 428 in the bridge communication (e.g., base) device 202_1 may operate in a command downstream mode, and may transmit a command (hereinafter, a second command, e.g., a status-read command) to the bridge communication device 202_n through the downstream communication port 220_1 (e.g., the port 420 shown in FIG. 4). The slave communication module 428 in the bridge communication device 202_n may also operate in the command downstream mode and transmit the second command to the bridge communication device 202_(n–1) through the downstream communication port 220_n. In a similar manner, the command may be relayed through the bridge communication devices 202_(n–1), 202_(n–2), . . . and 202_2. In response to the second command, the bridge communication devices 202_n-202_2 may send their response information (if there is any, e.g., status-response information) back to the ECU 214 in an information upstream mode. For example, the bridge communication device 202_2 may use its slave communication module 428 to transmit its own response information to the bridge communication device 202_3 through the upstream communication port 222_2 (e.g., the port 422 shown in FIG. 4), the slave communication module 428 in the bridge communication device 202_3 may receive the response information of the stacked/looped device 202_2 through the downstream communication port 220_3 and then relay the response information to the bridge communication device 202_4 through the upstream communication port 222_3, and so on, until the response information of the bridge communication device 202_2 reaches the base device 202_1, which then transmits the response information to the ECU 214. Response information for the other bridge communication devices can be sent to the ECU 214 in a similar manner. For example, the bridge communication device 202_3 may use its slave communication module 428 to transmit its own response information to the ECU 214 through the bridge communication devices 202_4, 202_5, . . . , 202_1, and through the upstream communication ports 222_3, 222_4, . . . , 222_n.

FIG. 6 illustrates an example of a flowchart 600 of operations performed by a battery monitoring system (e.g., 200), in an embodiment of the present invention. FIG. 6 is described in combination with FIG. 2, FIG. 3, FIG. 4, and FIG. 5.

In block 602, a first master communication module (e.g., 426) in a bridge communication (e.g., base) device (e.g., 402 or 202_1) receives an instruction (e.g., a direction-setting command/instruction) from a controller (e.g., ECU 214), where the base device is configured to receive first status information for a first battery (e.g., 210_1) from a first battery monitoring device (e.g., DFE 204_1) that monitors the status of the first battery.

In block 604, in response to receiving the instruction, a first slave communication module (e.g., 428) in the base device is configured to operate in a mode, e.g., either a command upstream mode or a command downstream mode.

In block 606, the first slave communication module transmits a first command through a first upstream communication port (e.g., 422 or 222_1) of the base device if the first slave communication module operates in the command upstream mode, or transmits a second command through a first downstream communication port (e.g., 420 or 220_1) of the base device if the first slave communication module operates in the command downstream mode.

In block 608, a second bridge communication device (e.g., 402; or 202_2, 202_3, . . . , or 202_n) receives a command of the first and second commands, where the second bridge communication device is configured to receive second status information for a second battery (e.g., 210_2, 210_3, . . . , or 210_n), which is coupled to the first battery, from a second battery monitoring device (e.g., 204_2, 204_3, . . . , or 204_n) that monitors the status of the second battery.

In block 610, in response to the command received in block 608, a second slave communication module (e.g., 428) in the second bridge communication device is configured to operate in a mode, e.g., an information upstream mode or an information downstream mode.

In block 612, the second slave communication module transmits the second status information to the controller through a second downstream communication port (e.g., 420, or 220_2, 220_3, . . . , or 220_n) if the second slave communication module operates in the information downstream mode, or transmits the second status information to the controller through a second upstream communication port (e.g., 422, or 222_2, 222_3, . . . , or 222_n) if the second slave communication module operates in the information upstream mode.

The battery monitoring system according to embodiments of the present invention includes multiple bridge communication devices, and each of the bridge communication devices can interface between an ECU and a corresponding DFE. The bridge communication devices are stacked or looped and can communicate with the ECU (or a host that includes the ECU) in a dual-direction daisy-chain manner. The bridge communication devices can be compatible with multiple types of DFEs that support different communication protocols, which can increase the adaptability and flexibility when communicating with different types of DFEs. If a failure occurs in one of the bridge communication devices or on a link between two adjacent bridge communication devices, then the dual-direction daisy-chain link can form two uni-direction daisy-chain links, such that the communication between the ECU and all of the bridge communication devices can still go on. In addition, a base device in the daisy-chain communicates directly with the ECU through one or more pins, and those pins in a stacked/looped bridge communication device can be reused for receiving information for environmental statuses of corresponding batteries, thus increasing utilization of the bridge communication devices.

While the foregoing description and drawings represent embodiments of the present invention, it will be understood that various additions, modifications, and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

We claim:

1. A battery monitoring system, comprising:

a plurality of bridge communication devices comprising a base bridge communication device coupled to a second bridge communication device, wherein said base bridge communication device is operable for receiving first information for a status of a first battery of a plurality of batteries from a first battery monitoring device that monitors said status of said first battery and for transmitting said first information to a controller, and wherein said base bridge communication device comprises an upstream communication port and a downstream communication port;

wherein said second bridge communication device is coupled to said base bridge communication device through said upstream communication port and said downstream communication port, and is operable for receiving second information for a status of a second battery of said plurality of batteries from a second battery monitoring device that monitors said status of said second battery and for transmitting said second information to said controller through said base bridge communication device;

wherein said base bridge communication device is further operable for receiving a direction-setting instruction from said controller;

wherein if said direction-setting instruction sets said plurality of bridge communication devices to communicate with said controller in an upstream direction, said base bridge communication device transmits a status-read command to said second bridge communication device through said upstream communication port and receives said second information from said second bridge communication device through said upstream communication port; and wherein if said direction-setting instruction sets said plurality of bridge communication devices to communicate with said controller in a downstream direction, said base bridge communication device transmits a status-read command to said second bridge communication device through said downstream communication port and receives said second information from said second bridge communication device through said downstream communication port.

2. The battery monitoring system of claim 1, wherein said base bridge communication device is operable for communicating with said first battery monitoring device via a first protocol and communicating with said controller via a second protocol.

3. The battery monitoring system of claim 2, wherein said first protocol comprises a communication protocol selected from the group consisting of UART (universal asynchronous receiver-transmitter) protocol, SPI (serial peripheral interface) protocol, and I²C (inter-integrated circuit) protocol.

4. The battery monitoring system of claim 1, wherein each bridge communication device of said plurality of bridge communication devices comprises a respective external communication port, wherein the external communication port of said base bridge communication device is operable for transmitting said first information to said controller, and wherein the external communication port of said second bridge communication device is operable for receiving information for an environmental status of said second battery from an external device.

5. The battery monitoring system of claim 4, wherein said environmental status comprises temperature.

6. The battery monitoring system of claim 1, wherein said plurality of bridge communication devices comprises said base bridge communication device coupled to other bridge communication devices that comprise said second bridge communication device, wherein each bridge communication device of said other bridge communication devices is operable for receiving, from a corresponding battery monitoring device, information for a status of a corresponding battery of said plurality of batteries, wherein said each bridge communication device comprises a respective upstream communication port and a respective downstream communication port, wherein in said upstream direction, said status-read command transmitted through said upstream communication port of said base bridge communication device is configured to instruct said each bridge communication device of said other bridge communication devices to transmit said information for said status of said corresponding battery to said controller through said respective downstream communication port, and wherein in said downstream direction, said status-read command transmitted through said downstream communication port of said base bridge communication device is configured to instruct said each bridge communication device of said other bridge communication devices to transmit said information for said status of said corresponding battery to said controller through said respective upstream communication port.

7. A method, comprising:

receiving, at a base bridge communication device of a plurality of bridge communication devices coupled to each other, first information for a status of a first battery of a plurality of batteries from a first battery monitoring device that monitors said status of said first battery;

transmitting said first information from said base bridge communication device to a controller;

receiving, at a second bridge communication device of said plurality of bridge communication devices, second information for a status of a second battery of said plurality of batteries from a second battery monitoring device that monitors said status of said second battery;

transmitting said second information from said second bridge communication device to said controller through said base bridge communication device;

receiving, at said base bridge communication device, a direction-setting instruction from said controller;

if said direction-setting instruction sets said plurality of bridge communication devices to communicate with said controller in an upstream direction, transmitting a status-read command to said second bridge communication device through an upstream communication port of said base bridge communication device and receiving said second information from said second bridge communication device at said upstream communication port; and if said direction-setting instruction sets said plurality of bridge communication devices to communicate with said controller in a downstream direction, transmitting a status-read command to said second bridge communication device through a downstream communication port of said base bridge communication device and receiving said second information from said second bridge communication device at said downstream communication port.

8. The method of claim 7, wherein each bridge communication device of said plurality of bridge communication devices comprises a respective external communication port, and wherein said method further comprises:

transmitting said first information to said controller from said base bridge communication device through the external communication port of said base bridge communication device; and receiving, at the external communication port of said second bridge communication device, information for an environmental status of said second battery from an external device.

9. The method of claim 8, wherein said environmental status comprises temperature.

10. The method of claim 7, wherein said plurality of bridge communication devices comprises said base bridge communication device and other bridge communication devices that comprise said second bridge communication device, and wherein said method further comprises:

receiving, at each bridge communication device of said other bridge communication devices, information for a status of a corresponding battery of said plurality of batteries, wherein said each bridge communication device comprises a respective upstream communication port and a respective downstream communication port;

if said direction-setting instruction sets said plurality of bridge communication devices to communicate with said controller in said upstream direction, instructing, using said status-read command transmitted through said upstream communication port of said base bridge communication device, said each bridge communication device of said other bridge communication devices to send said information for said status of said corresponding battery to said controller through said respective downstream communication port; and if said direction-setting instruction sets said plurality of bridge communication devices to communicate with said controller in said downstream direction, instructing, using said status-read command transmitted through said downstream communication port of said base bridge communication device, said each bridge communication device of said other bridge communication devices to send said information for said status of said corresponding battery to said controller through said respective upstream communication port.

11. The method of claim 7, further comprising:

communicating, using said base bridge communication device, with said first battery monitoring device via a first protocol; and communicating, using said base bridge communication device, with said controller via a second protocol.

12. The method of claim 11, wherein said first protocol comprises a communication protocol selected from the group consisting of UART (universal asynchronous receiver-transmitter) protocol, SPI (serial peripheral interface) protocol, and I$^2$C (inter-integrated circuit) protocol.

* * * * *